(12) United States Patent
Park

(10) Patent No.: US 8,971,108 B2
(45) Date of Patent: Mar. 3, 2015

(54) SEMICONDUCTOR MEMORY DEVICE AND METHOD FOR DRIVING THE SAME

(75) Inventor: Heat-Bit Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 371 days.

(21) Appl. No.: 13/489,921

(22) Filed: Jun. 6, 2012

(65) Prior Publication Data

US 2013/0163364 A1  Jun. 27, 2013

(30) Foreign Application Priority Data

Dec. 21, 2011 (KR) .......................... 10-2011-0139613

(51) Int. Cl.
*G11C 11/34* (2006.01)
(52) U.S. Cl.
USPC .................. 365/174; 365/189.17; 365/230.01; 365/230.02; 365/230.03
(58) Field of Classification Search
USPC .................. 365/174, 189.17, 230.01, 230.02, 365/230.03
See application file for complete search history.

(56) References Cited

U.S. PATENT DOCUMENTS

| 7,206,213 | B2 | 4/2007 | Kim | |
|---|---|---|---|---|
| 8,516,185 | B2 * | 8/2013 | Lee et al. | 711/104 |
| 2011/0093235 | A1 * | 4/2011 | Oh et al. | 702/120 |

FOREIGN PATENT DOCUMENTS

| KR | 100585117 | 6/2006 |
|---|---|---|
| KR | 1020070036294 | 4/2007 |
| KR | 100753099 | 8/2007 |
| KR | 100988811 | 10/2010 |

* cited by examiner

*Primary Examiner* — Han Yang
(74) *Attorney, Agent, or Firm* — IP & T Group LLP

(57) ABSTRACT

A semiconductor memory device includes a first semiconductor chip including a first pad group configured to input/output first data and a second pad group configured to input/output second data; and a second semiconductor chip in a stack with the first semiconductor chip and configured to be electrically connected to the first semiconductor chip by at least one chip through via, wherein the second semiconductor chip includes a first unit bank group including at least one first upper bank group and at least one first lower bank group, a second unit bank group including at least one second upper bank group and at least one second lower bank group, and a data path selector configured to electrically connect one among the first and second upper bank groups and the first and second lower bank groups with the chip through via.

12 Claims, 5 Drawing Sheets

FIG. 1
(PRIOR ART)

| BANK0 64M (UDQ) | BANK1 64M (UDQ) | X D E C | | X D E C | BANK2 64M (UDQ) | BANK3 64M (UDQ) |
|---|---|---|---|---|---|---|
| BANK0 64M (LDQ) | BANK1 64M (LDQ) | | | | BANK2 64M (LDQ) | BANK3 64M (LDQ) |
| YDEC | | | | | YDEC | |

GIO1 /128    GIO2 /128

| YDEC | | | | | YDEC | |
|---|---|---|---|---|---|---|
| BANK4 64M (UDQ) | BANK5 64M (UDQ) | X D E C | | X D E C | BANK6 64M (UDQ) | BANK7 64M (UDQ) |
| BANK4 64M (LDQ) | BANK5 64M (LDQ) | | | | BANK6 64M (LDQ) | BANK7 64M (LDQ) |

Structure of 1G BANK
 8BANK = 128M * 8 = 1G
 8BANK = 64M(DQ0~DQ7) * 8 +
         64M(DQ8~DQ15) * 8 = 1G

| BANK0 64M (UDQ) | BANK1 64M (UDQ) | X D E C |
|---|---|---|
| BANK2 64M (UDQ) | BANK3 64M (UDQ) | |
| YDEC | | |

| X D E C | BANK0' 64M (LDQ) | BANK1' 64M (LDQ) |
|---|---|---|
| | BANK2' 64M (LDQ) | BANK3' 64M (LDQ) |
| | YDEC | |

GIO11 /64    GIO12 /64

| YDEC | | |
|---|---|---|
| BANK4 64M (UDQ) | BANK5 64M (UDQ) | X D E C |
| BANK6 64M (UDQ) | BANK7 64M (UDQ) | |

| | YDEC | |
|---|---|---|
| X D E C | BANK4' 64M (LDQ) | BANK5' 64M (LDQ) |
| | BANK6' 64M (LDQ) | BANK7' 64M (LDQ) |

SEMICONDUCTOR MEMORY DEVICE AND METHOD FOR DRIVING THE SAME

CROSS-REFERENCE TO RELATED APPLICATIONS

The present application claims priority of Korean Patent Application No. 10-2011-0139613, filed on Dec. 21, 2011, which is incorporated herein by reference in its entirety.

BACKGROUND

1. Field

Exemplary embodiments of the present invention relate to a semiconductor designing technology, and more particularly, to a semiconductor memory device having a stacked structure and a method for driving the semiconductor memory device.

2. Description of the Related Art

The development of packing technology has resulted in smaller sizes in semiconductor devices and improved packaging reliability. As high performance is also desired, further developments in stacked packages have developed.

A "stack" is at least two semiconductor chips or packages vertically piled in a semiconductor device. For example, when the stacked package is applied to a semiconductor memory device, such as a Dynamic Random Access Memory (DRAM) device, the semiconductor memory device may have a memory capacity of more than twice a memory capacity of an integrated semiconductor without stacked packages. Also, since the stacked package is advantageous in terms of packaging density and packaging area in addition to the increase in memory capacity, research and development on the stacked package are being accelerated.

There are two methods for fabricating a stacked package. The first method stacks individual semiconductor chips and subsequently packages the stacked semiconductor chips all at once, and the second method stacks packaged individual semiconductor chips. The individual semiconductor chips of a stacked package are electrically connected through a metal wire or by chip through vias. Specifically, in a stacked package using chip through vias, semiconductor chips are physically and electrically connected with each other in a vertical direction through the chip through vias that are formed in the inside of the semiconductor chips.

Additionally, among the semiconductor chips included in a stacked package, a semiconductor chip that is coupled with an external device and receives and transfers power and data is referred to as a master chip, and a semiconductor chip that stores and provides data under the control of the master chip is referred to as a slave chip. In particular, technology that includes, for example, only a core region in a slave chip is being developed to minimize the size of the slave chip.

FIG. 1 illustrates an internal structure of a slave chip included in a semiconductor memory device according to a prior art.

Referring to FIG. 1, the slave chip includes a plurality of banks BANK0 to BANK7 for storing and providing data, and a plurality of first global input/output lines GIO1 and a plurality of second global input/output lines GIO2 for inputting/outputting data between the banks BANK0 to BANK7 and a master chip (not shown).

The banks BANK0 to BANK7 are respectively divided corresponding to a first data pad group UDQ and a second data pad group LDQ, and a first group of banks BANK0, BANK1, BANK4 and BANK5 share the first global input/output lines GIO1, and a second group of banks BANK2, BANK3, BANK6 and BANK7 share the second global input/output lines GIO2.

For example, when a slave chip has a density of approximately 1 G bits and includes eight banks, each bank has a density of approximately 128M bits. In other words, each half bank has a density of approximately 64M bits. More specifically, the first data pad group UDQ and the second data pad group LDQ each have a density of approximately 64M bits. Therefore, the slave chip includes a memory cell corresponding to approximately 128M bits for each bank and approximately 128 global input/output lines GIO1 and GIO2.

The slave chip having the above structure requires the number of the global input/output lines GIO11 or GIO12 corresponding to the number of memory cells, the area of the slave chip shown in FIG. 1 maybe increased. Further, since the slave chip has a structure of sharing the global input/output lines GIO11 or GIO12 for some banks BANK0, BANK1, BANK4 and BANK5 or BANK2, BANK3, BANK6 and BANK7, line loading of the global input/output lines GIO11 and GIO12 may increase.

SUMMARY

An embodiment of the present invention is directed to a semiconductor memory device that the data path is optimized, and a method for driving the semiconductor memory device.

Another embodiment of the present invention is directed to a semiconductor memory device that the area is decreased to decrease the amount of line loading of global input/output lines, and a method for driving the semiconductor memory device.

In accordance with an embodiment of the present invention, a semiconductor memory device includes: a first semiconductor chip including a first pad group configured to input/output first data and a second pad group configured to input/output second data and a second semiconductor chip in a stack with the first semiconductor chip and configured to be electrically connected to the first semiconductor chip by at least one chip through via vertically extending through the second semiconductor chip for interfacing the first data and the second data, wherein the second semiconductor chip includes a first unit bank group including at least one first upper bank group and at at least one first lower bank group, wherein the first upper bank group and the first lower bank group are configured to store and provide the first data; a second unit bank group including at least one second upper bank group and at least one second lower bank group, wherein the second upper bank group and the second lower bank group are configured to store and provide the second data; and a data path selector configured to electrically connect one among the first and second upper bank groups and the first and second lower bank groups with the chip through via in response to at least one unit bank group selection signal and at least one upper/lower bank group selection signal.

In accordance with another embodiment of the present invention, a method for driving a semiconductor memory device, includes: inputting/outputting data through one among a first pad group and a second pad group in response to a data width option mode enabled by a data width option signal; selecting one between a first unit bank group and a second unit bank group as a data path in response to an address signal and selecting one among first and second upper bank groups and first and second lower bank groups as the data path in response to a bank address signal; and transferring the data between the selected bank group among the first to fourth banks and a chip through via.

BRIEF DESCRIPTION OF THE DRAWINGS

FIG. 1 illustrates an internal structure of a slave chip included in a semiconductor memory device according to a prior art.

FIG. 3 illustrates an internal structure of a slave chip shown in FIG. 3.

DETAILED DESCRIPTION

Figure 2:
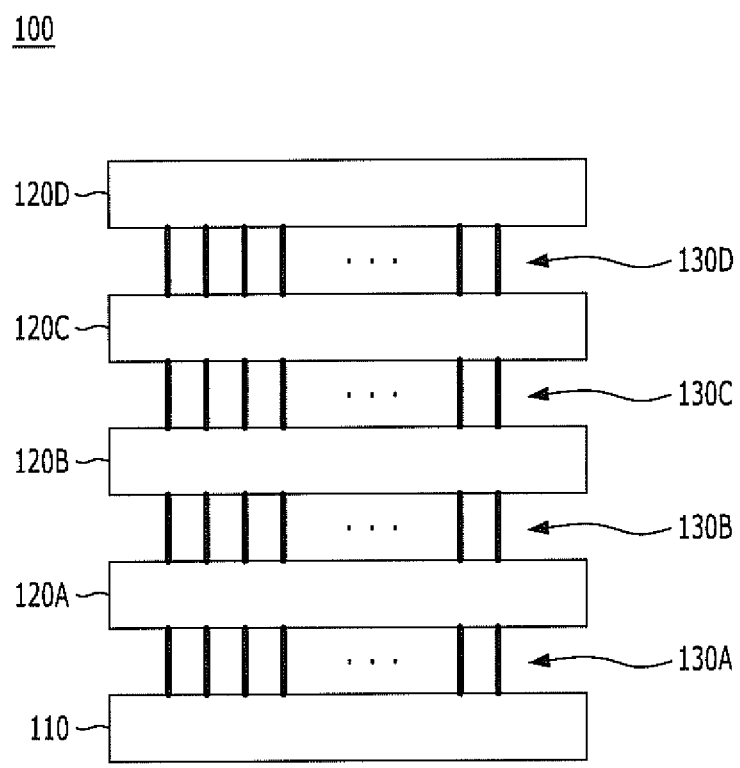
FIG. 2 is a conceptual side view of a semiconductor memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 2 is a conceptual side view of a semiconductor memory device in accordance with an embodiment of the present invention.

Referring to FIG. 2, the semiconductor memory device 100 includes a master chip 110, a plurality of slave chips, which are first to fourth slave chips 120A, 120B, 120C, and 120D, and a plurality of chip through vias, which are first to fourth chip through vias 130A, 130B, 130C, and 130D. The master chip 110 transfers and receives signals, power, and data to and from an external device (not shown). The first to fourth slave chips 120A, 120B, 120C, and 120D are sequentially stacked over the master chip 110 and store and provide data under the control of the master chip 110. The first to fourth chip through vias 130A, 130B, 130C, and 130D vertically extend through the first to fourth slave chips 120A, 120B, 120C, and 120D, respectively, and interface data between the master chip 110 and the first to fourth slave chips 120A, 120B, 120C, and 120D.

The master chip 110 includes a plurality of data pads (not shown) for receiving and transferring data with an external device. In this embodiment, the master chip 110 includes 16 data pads, and among them, first to eighth data pads are referred to as a first data pad group UDQ, and ninth to sixteenth data pads are referred to a second data pad group LDQ.

Each of the first to fourth slave chips 120A, 120B, 120C, and 120D has a structure for storing and providing data under the control of the master chip 110. Since the first to fourth slave chips 120A, 120B, 120C, and 120D have the same structure, the first slave chip 120A is representatively described hereafter.

FIG. 3 illustrates an internal structure of a first slave chip 120A shown in FIG. 2.

Referring to FIG. 3, slave chip groups half banks corresponding to the first data pad group UDQ and the second data pad group LDQ. For example, first to eighth half banks BANK0 to BANK7 corresponding to the first data pad group UDQ form one bank group, and first to eighth half banks BANK0' to BANK7' corresponding to the second data pad group LDQ form another bank group. When the slave chip is formed as described above, 64 first or second global input/output lines GIO11 or GIO12 may be provided for each bank group BANK0 to BANK7 or BANK0' to BANK7'. Therefore, an area of the semiconductor memory device may be reduced because as many as half of the global input/output lines included in the semiconductor memory device of FIG. 1 are not included in the semiconductor memory device of FIG. 3.

Additionally, although not illustrated in FIG. 2, approximately 128 chip through vias 130A corresponding to the total of 128 global input/output lines GIO11 and GIO12 are provided. The chip through vias 130A may be through silicon vias. The chip through vias 130A are formed to vertically extend through the first slave chip 120A and electrically connect to the master chip 110. The chip through vias 130A are used to transfer data between the master chip 110 and the global input/output lines GIO11 and GIO12.

The first slave chip 120A having the above structure may be able to decrease the number of global input/output lines compare to the slave chip shown in FIG. 1, but there is a limitation to decrease the area of the slave chip. Further, since the first slave chip 120A has a structure of sharing the global input/output lines GIO11 or GIO12 for each bank group BANK0 to BANK7 or BANK0' to BANK7', a lot of line loading of the global input/output lines GIO11 and GIO12 still remains.

Figure 4:
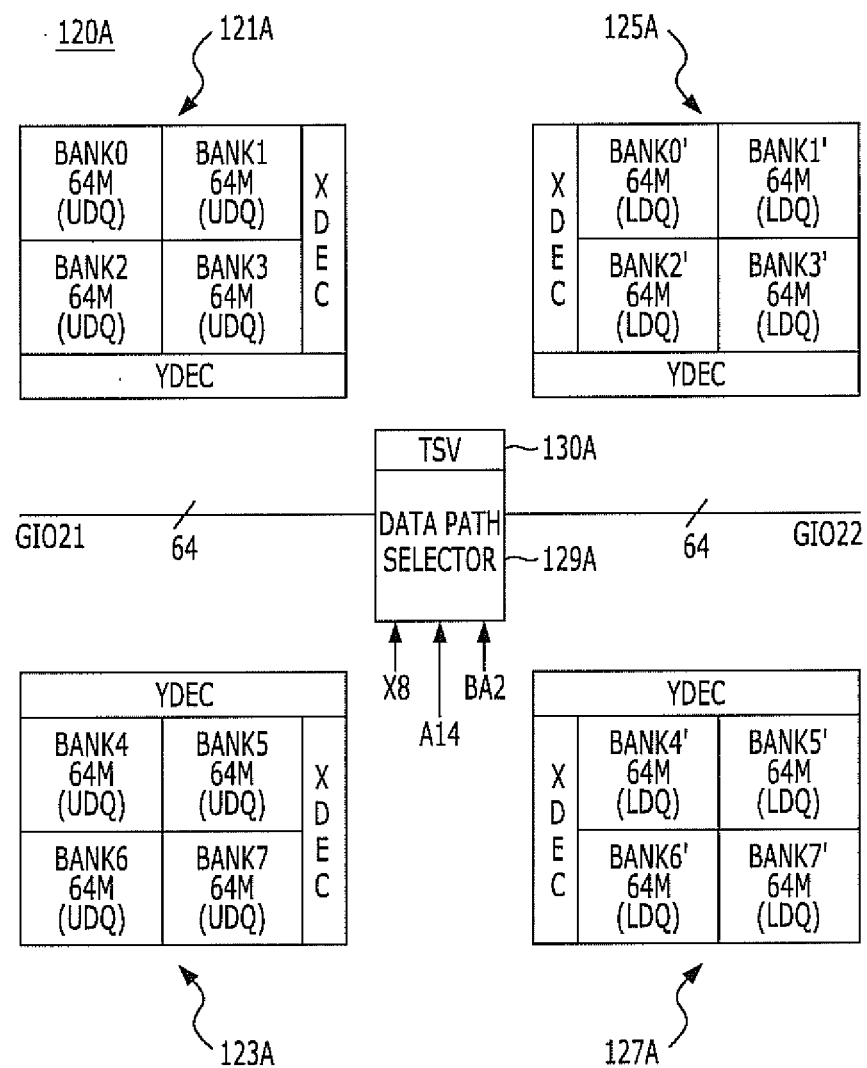
FIG. 4 illustrates another internal structure of the slave chip shown in FIG. 3.
Figure 5:
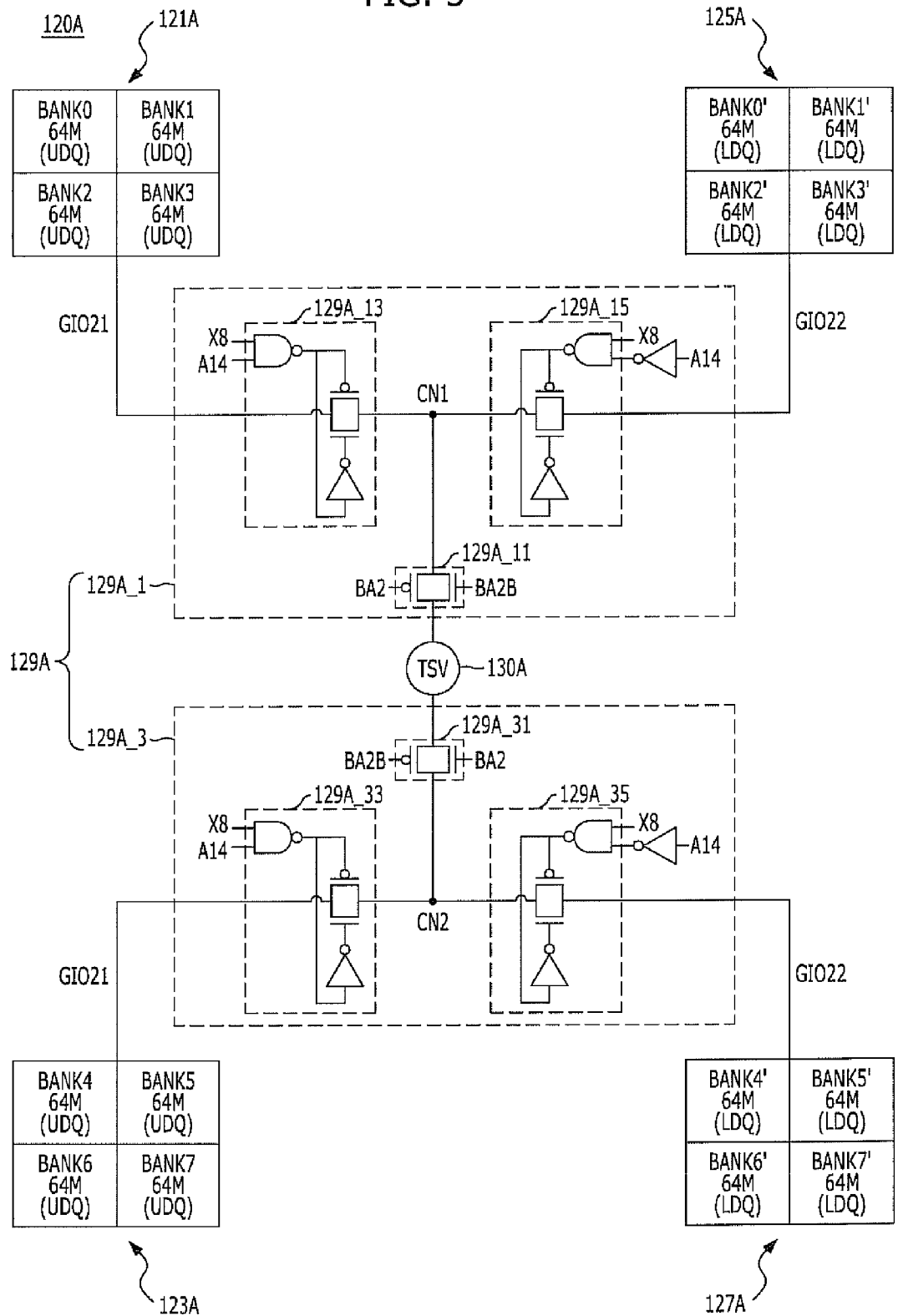
FIG. 5 is a block view illustrating the slave chip shown in FIG. 4 in detail.

FIG. 4 illustrates another internal structure of a first slave chip 120A shown in FIG. 2. FIG. 5 is a block view illustrating the first slave chip 120A shown in FIG. 4 in detail.

Referring to FIG. 4, the first slave chip 120A includes a first Unit bank group 121A and 123A, a second unit bank group 125A and 127A, a data path selector 129A, a plurality of first global input/output lines GIO21, and a plurality of second global input/output lines GIO22. The first unit bank group 121A and 123A includes a first upper bank group BANK0 to BANK3 and a first lower bank group BANK4 to BANK7 that store and provide first data that are inputted/outputted through the first data pad group UDQ. The second unit bank group 125A and 127A includes a second upper bank group BANK0' to BANK3' and a second lower bank group BANK4' to BANK7' that store and provide second data that are inputted/outputted through the second data pad group LDQ.

The data path selector 129A electrically connects any one among the first and second upper bank groups BANK0 to BANK3 and BANK0' to BANK3' and the first and second lower bank groups BANK4 to BANK7 and BANK4' to BANK7' with a plurality of first chip through vias 130A in response to a unit bank group selection signal (X8, A14) and an upper/lower bank selection signal BA2. The first global input/output lines GIO21 couple the first unit bank group 121A and 123A with the plurality of first chip through vias 130A. The second global input/output lines GIO22 couple the second unit bank group 125A and 127A with the plurality of first chip through vias 130A. Here, the unit bank group selection signal includes at least one data width option signal and at least one address signal, the upper/lower bank selection signal includes at least one bank address signal. Hereinafter, the data width option signal X8 and the address signal A14 are representatively described as the unit bank group selection signal, and the bank address signal BA2 is representatively described as the upper/lower bank group selection signal.

The data path selector 129A will be described in detail with reference to FIG. 5. Although the data path selector 129A is illustrated to correspond to one first chip through via 130A, one first global input/output line GIO21, and one second global input/output line GIO22 for illustration purposes, a data path selector 129A corresponding to the density of each bank, which is 64M bits, 64 first chip through vias 130A, 64 first global input/output lines GIO21, and 64 second global input/output lines GIO22 is to be provided.

Referring to FIG. 5, a data path selector 129A includes a first multiplexing unit 129A_1 and a second multiplexing unit 129A_3. The first multiplexing unit 129A_1 electrically connects any one among a first upper bank group 121A and a second upper bank group 125A with the chip through vias 130A in response to the data width option signal X8, the address signal A14, and the bank address signal BA2. The second multiplexing unit 129A_3 electrically connects any one among a first lower bank group 123A and a second lower bank group 127A with the chip through vias 130A in response to the data width option signal X8, the address signal A14, and the bank address signal BA2.

The first multiplexing unit 129A_1 includes a first bank path selection element 129A_11, a first group path selection element 129A_13, and a second group path selection element 129A_15. The first bank path selection element 129A_11 selectively couples a first coupling node CN1 with a chip through via 130A in response to the bank address signal BA2. The first group path selection element 129A_13 selectively couples the first coupling node CN1 with the first upper bank group 121A in response to the data width option signal X8 and the address signal A14. The second group path selection element 129A_15 selectively couples the first coupling node CN1 with the second upper bank group 125A in response to the data width option signal X8 and an inverted address signal, which is an inverted signal of the address signal A14.

The second multiplexing unit 129A_3 includes a second bank path selection element 129A_31, a third group path selection element 129A_33, and a fourth group path selection element 129A_35. The second bank path selection element 129A_31 selectively couples a second coupling node CN2 with a chip through via 130A in response to the bank address signal BA2. The third group path selection element 129A_33 selectively couples the second coupling node CN2 with the first lower bank group 123A in response to the data width option signal X8 and the address signal A14. The fourth group path selection element 129A_35 selectively couples the second coupling node CN2 with the second lower bank group 127A in response to the data width option signal X8 and the inverted address signal, which is an inverted signal of the address signal A14.

In this embodiment, the plurality of chip through vias 130A may include through silicon vias (TSV).

Hereafter, a method for driving the semiconductor memory device 100 having the above-described structure is described in accordance with an embodiment of the present invention. In this embodiment, a write operation is performed in an X8 mode where data is inputted/outputted through 8 data pads, which are a first data pad group UDQ and a second data pad group LDQ, as an example, and the operation of the first slave chip 120A during the write operation is representatively described.

When a data is inputted through the first data pad group UDQ (not shown) of a master chip, the master chip transfers the data to the first slave chip 120A through the plurality of chip through vias 130A.

In the first slave chip 120A, any one between the first multiplexing unit 129A_1 and the second multiplexing unit 129A_3 is enabled, and the data transferred through the chip through vias 130A is transferred to any one among the first and second upper bank groups 121A and 125A, and first and second lower bank groups 123A and 127A through the first multiplexing unit 129A_1 or the second multiplexing unit 129A_3. More specifically, the address signal A14 decides which unit bank group between the first unit bank group 121A and 123A and the second unit bank group 125A and 127A is to be coupled to the chip through vias 130A. Also, the bank address signal BA2 decides which bank group among the first and second upper/lower bank groups 121A, 123A, 125A and 127A is to be coupled with the chip through vias 130A. For example, when data is inputted through the first data pad group UDQ and any one bank BANK0, BANK1, BANK2, or BANK3 that belongs to the first upper bank group 121A is enabled, the first multiplexing unit 129A_1 is enabled according to the bank address signal BA2 of a logic low level, and as the first global input/output lines GIO21 are coupled with the chip through vias 130A through the first multiplexing unit 129A_1 according to the address signal A14 of a logic high level, the data transferred through the chip through vias 130A is transferred to the first upper bank group 121A. In this example, the first global input/output lines GIO21 coupled with the first lower bank group 123A is electrically disconnected by the disabled second multiplexing unit 129A_3.

According to an embodiment of the present invention, since data transferred to different bank groups may be transferred through one chip through via, the number of the chip through vias may be decreased. Also, when data is transferred to a particular bank group, line loading on the global input/output lines may be reduced by electrically disconnecting other data paths.

According to an embodiment of the present invention, since the number of global input/output lines and the number of chip through vias may be decreased, production time and cost may be saved while decreasing an area of a semiconductor memory device.

Also, line loading of global input/output lines may be decreased by selectively coupling a global input/output line that is shared for each bank group with an enabled bank. Therefore, data transition time may be reduced, contributing to a performance improvement of a semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a first semiconductor chip including a first pad group configured to input/output first group data and a second pad group configured to input/output second group data; and
a second semiconductor chip in a stack with the first semiconductor chip and configured to be electrically connected to the first semiconductor chip by at least one chip through via vertically extending through the second semiconductor chip for interfacing the first group data and the second group data,
wherein the second semiconductor chip comprises:
a first unit bank group including at least one first upper bank group and at least one first lower bank group, wherein the first upper bank group and the first lower bank group are configured to store and provide the first group data;
a second unit bank group including at least one second upper bank group and at least one second lower bank group, wherein the second upper bank group and the second lower bank group are configured to store and provide the second group data; and a data path selector configured to electrically connect one among the first and second upper bank groups and the first and second lower bank groups with the chip through via in response to at least one unit bank group selection signal and at least one upper/lower bank group selection signal.

2. The semiconductor memory device of claim 1, wherein the data path selector comprises:
   a first multiplexing unit configured to electrically connect one among the first upper bank group and the second upper bank group with the chip through via in response to the unit bank group selection signal and the upper/lower bank group selection signal; and
   a second first multiplexing unit configured to electrically connect one among the first lower bank group and the second lower bank group with the chip through via in response to the unit bank group selection signal and the upper/lower bank group selection signal.

3. The semiconductor memory device of claim 2, wherein the unit bank group selection signal includes at least one data width option signal and at least one address signal, and the upper/lower bank selection signal includes at least one bank address signal.

4. The semiconductor memory device of claim 3, wherein the first multiplexing unit comprises:
   a first bank path selection element configured to electrically connect a first coupling node with the chip through via in response to the bank address;
   a first group path selection element configured to electrically connect the first coupling node with the first upper bank group in response to the data width option signal and the address signal; and
   a second group path selection element configured to electrically connect the first coupling node with the second upper bank group in response to the data width option signal and an inverted signal of the address signal.

5. The semiconductor memory device of claim 3, wherein the second multiplexing unit comprises:
   a second bank path selection element configured to electrically connect a second coupling node with the chip through via in response to the bank address;
   a third group path selection element configured to electrically connect the second coupling node with the first lower bank group in response to the data width option signal and the address signal; and
   a fourth group path selection element configured to electrically connect the second coupling node with the second lower bank group in response to the data width option signal and an inverted signal of the address signal.

6. The semiconductor memory device of claim 1, wherein each of the first and second upper bank groups and the first and second lower bank groups includes at least one unit bank.

7. The semiconductor memory device of claim 6, further comprising:
   a plurality of global input/output lines configured to substantially couple the first and second unit bank groups with the chip through via.

8. The semiconductor memory device of claim 7, wherein the plurality of global input/output lines comprise:
   a plurality of first global input/output lines configured to be shared by the first upper bank group and the first lower bank group; and
   a plurality of second global input/output lines configured to be shared by the second upper bank group and the second lower bank group.

9. The semiconductor memory device of claim 8, wherein the plurality of first global input/output lines and the plurality of second global input/output lines are provided in correlation to the density of the unit bank.

10. The semiconductor memory device of claim 1, wherein the chip through via includes a through silicon via (TSV).

11. A method for driving a semiconductor memory device, comprising:
   inputting/outputting data through one among a first pad group and a second pad group in response to a data width option mode enabled by a data width option signal;
   selecting one between a first unit bank group and a second unit bank group as a data path in response to an address signal and selecting one among first and second upper bank groups and first and second lower bank groups as the data path in response to a bank address signal; and
   transferring the data between the selected bank group among the first to fourth banks and a chip through via.

12. The method of claim 11, wherein bank groups not selected by the address signal and the bank address signal among first and second upper bank groups and first and second lower bank groups are electrically disconnected from the chip through via.

* * * * *